United States Patent
Rumbaugh

(10) Patent No.: US 7,176,705 B2
(45) Date of Patent: Feb. 13, 2007

(54) THERMAL OPTICAL CHUCK

(75) Inventor: Scott Rumbaugh, Tigard, OR (US)

(73) Assignee: Cascade Microtech, Inc., Beaverton, OR (US)

( * ) Notice: Subject to any disclaimer, the term of this patent is extended or adjusted under 35 U.S.C. 154(b) by 0 days.

(21) Appl. No.: 11/123,687

(22) Filed: May 6, 2005

(65) Prior Publication Data

US 2005/0270056 A1    Dec. 8, 2005

Related U.S. Application Data

(60) Provisional application No. 60/577,752, filed on Jun. 7, 2004.

(51) Int. Cl.
*G01R 31/26* (2006.01)
(52) U.S. Cl. .................................................. 324/765
(58) Field of Classification Search ............... 324/765, 324/158.1, 760, 752, 753; 356/479, 497, 356/239.1
See application file for complete search history.

(56) References Cited

U.S. PATENT DOCUMENTS

| | | |
|---|---|---|
| 1,337,866 A | 4/1920 | Whitaker |
| 2,142,625 A | 1/1939 | Zoethout |
| 2,197,081 A | 4/1940 | Piron |
| 2,376,101 A | 5/1945 | Tyzzer |
| 2,389,668 A | 11/1945 | Johnson |
| 2,471,897 A | 5/1949 | Rappl |
| 2,812,502 A | 11/1957 | Doherty |
| 3,176,091 A | 3/1965 | Hanson et al. |
| 3,185,927 A | 5/1965 | Margulis et al. |
| 3,192,844 A | 7/1965 | Szasz et al. |
| 3,193,172 A | 7/1965 | Harris |
| 3,201,721 A | 8/1965 | Voelcker |
| 3,230,299 A | 1/1966 | Radziejowski |
| 3,256,484 A | 6/1966 | Terry |
| 3,265,969 A | 8/1966 | Catu |
| 3,289,046 A | 11/1966 | Carr |
| 3,333,274 A | 7/1967 | Forcier |
| 3,405,381 A | 10/1968 | Kattner et al. |
| 3,408,565 A | 10/1968 | Frick et al. |
| 3,435,185 A | 3/1969 | Gerard |
| 3,484,679 A | 12/1969 | Hodgson et al. |

(Continued)

FOREIGN PATENT DOCUMENTS

DE    29 12 826    10/1980

(Continued)

OTHER PUBLICATIONS

Christophe Risacher, Vessen Vassilev, Alexey Pavolotsky, and Victor Belitsky, "Waveguide-to-Microstrip Transition With Integrated Bias-T," IEEE Microwave and Wireless Components Letters, vol. 13, No. 7, Jul. 2003, pp. 262-264.

(Continued)

*Primary Examiner*—Ha Tran Nguyen
*Assistant Examiner*—Tung X. Nguyen
(74) *Attorney, Agent, or Firm*—Chernoff, Vilhauer, McClung & Stenzel

(57) ABSTRACT

An accessible optical path to a lower surface of a heatable device under test is provided by a thermal optical chuck comprising a transparent resistor deposited on transparent plate arranged to supporting the device in a probe station.

17 Claims, 3 Drawing Sheets

U.S. PATENT DOCUMENTS

| | | |
|---|---|---|
| 3,596,228 A | 7/1971 | Reed, Jr. et al. |
| 3,602,845 A | 8/1971 | Agrios et al. |
| 3,609,539 A | 9/1971 | Gunthert |
| 3,648,169 A | 3/1972 | Wiesler |
| 3,654,573 A | 4/1972 | Graham |
| 3,662,318 A | 5/1972 | Decuyper |
| 3,710,251 A | 1/1973 | Hagge et al. |
| 3,714,572 A | 1/1973 | Ham et al. |
| 3,775,644 A | 11/1973 | Cotner et al. |
| 3,777,260 A | 12/1973 | Davies et al. |
| 3,810,017 A | 5/1974 | Wiesler et al. |
| 3,814,888 A | 6/1974 | Bowers et al. |
| 3,829,076 A | 8/1974 | Sofy |
| 3,863,181 A | 1/1975 | Glance et al. |
| 3,866,093 A | 2/1975 | Kusters et al. |
| 3,930,809 A | 1/1976 | Evans |
| 3,936,743 A | 2/1976 | Roch |
| 3,970,934 A | 7/1976 | Aksu |
| 3,996,517 A | 12/1976 | Fergason et al. |
| 4,001,685 A | 1/1977 | Roch |
| 4,008,900 A | 2/1977 | Khoshaba |
| 4,009,456 A | 2/1977 | Hopfer |
| 4,027,253 A | 5/1977 | Chiron et al. |
| 4,035,723 A | 7/1977 | Kvaternik |
| 4,038,894 A | 8/1977 | Knibbe et al. |
| 4,042,119 A | 8/1977 | Hassan et al. |
| 4,049,252 A | 9/1977 | Bell |
| 4,066,943 A | 1/1978 | Roch |
| 4,093,988 A | 6/1978 | Scott |
| 4,099,120 A | 7/1978 | Aksu |
| 4,115,735 A | 9/1978 | Stanford |
| 4,115,736 A | 9/1978 | Tracy |
| 4,116,523 A | 9/1978 | Coberly et al. |
| 4,151,465 A | 4/1979 | Lenz |
| 4,161,692 A | 7/1979 | Tarzwell |
| 4,172,993 A | 10/1979 | Leach |
| 4,186,338 A | 1/1980 | Fichtenbaum |
| 4,275,446 A | 6/1981 | Blaess |
| 4,280,112 A | 7/1981 | Eisenhart |
| 4,284,033 A | 8/1981 | delRio |
| 4,284,682 A | 8/1981 | Frosch et al. |
| 4,287,473 A | 9/1981 | Sawyer |
| 4,342,958 A | 8/1982 | Russell |
| 4,346,355 A | 8/1982 | Tsukii |
| 4,352,061 A | 9/1982 | Matrone |
| 4,357,575 A | 11/1982 | Uren et al. |
| 4,365,109 A | 12/1982 | O'Loughlin |
| 4,365,195 A | 12/1982 | Stegens |
| 4,371,742 A | 2/1983 | Manly |
| 4,376,920 A | 3/1983 | Smith |
| 4,383,178 A | 5/1983 | Shibata et al. |
| 4,414,638 A | 11/1983 | Talambrias |
| 4,419,626 A | 12/1983 | Cedrone et al. |
| 4,425,395 A | 1/1984 | Negishi et al. |
| 4,426,619 A | 1/1984 | Demand |
| 4,473,798 A | 9/1984 | Cedrone et al. |
| 4,479,690 A | 10/1984 | Inouye et al. |
| 4,480,223 A | 10/1984 | Aigo |
| 4,487,996 A | 12/1984 | Rabinowitz et al. |
| 4,491,173 A | 1/1985 | Demand |
| 4,503,335 A | 3/1985 | Takahashi |
| 4,507,602 A | 3/1985 | Aguirre |
| 4,528,504 A | 7/1985 | Thornton, Jr. et al. |
| 4,531,474 A | 7/1985 | Inuta |
| 4,532,423 A | 7/1985 | Tojo et al. |
| 4,557,599 A | 12/1985 | Zimring |
| 4,566,184 A | 1/1986 | Higgins et al. |
| 4,567,321 A | 1/1986 | Harayama |
| 4,567,908 A | 2/1986 | Bolsterli |
| 4,575,676 A | 3/1986 | Palkuti |
| 4,588,970 A | 5/1986 | Donecker et al. |
| 4,621,169 A | 11/1986 | Petinelli et al. |
| 4,626,618 A | 12/1986 | Takaoka et al. |
| 4,642,417 A | 2/1987 | Ruthrof et al. |
| 4,646,005 A | 2/1987 | Ryan |
| 4,665,360 A | 5/1987 | Phillips |
| 4,673,839 A | 6/1987 | Veenendaal |
| 4,675,600 A | 6/1987 | Gergin |
| 4,680,538 A | 7/1987 | Dalman et al. |
| 4,684,883 A | 8/1987 | Ackerman et al. |
| 4,691,831 A | 9/1987 | Suzuki et al. |
| 4,694,245 A | 9/1987 | Frommes |
| 4,695,794 A | 9/1987 | Bargett et al. |
| 4,697,143 A | 9/1987 | Lockwood et al. |
| 4,703,433 A | 10/1987 | Sharrit |
| 4,711,563 A | 12/1987 | Lass |
| 4,712,370 A | 12/1987 | MacGee |
| 4,727,637 A | 3/1988 | Buckwitz et al. |
| 4,730,158 A | 3/1988 | Kasai et al. |
| 4,731,577 A | 3/1988 | Logan |
| 4,734,872 A | 3/1988 | Eager et al. |
| 4,739,259 A | 4/1988 | Hadwin et al. |
| 4,744,041 A | 5/1988 | Strunk et al. |
| 4,755,746 A | 7/1988 | Mallory et al. |
| 4,755,874 A | 7/1988 | Esrig et al. |
| 4,757,255 A | 7/1988 | Margozzi |
| 4,758,785 A | 7/1988 | Rath |
| 4,759,712 A | 7/1988 | Demand |
| 4,771,234 A | 9/1988 | Cook et al. |
| 4,772,846 A | 9/1988 | Reeds |
| 4,777,434 A | 10/1988 | Miller et al. |
| 4,783,625 A | 11/1988 | Harry et al. |
| 4,784,213 A | 11/1988 | Eager et al. |
| 4,786,867 A | 11/1988 | Yamatsu |
| 4,787,752 A | 11/1988 | Fraser et al. |
| 4,791,363 A | 12/1988 | Logan |
| 4,810,981 A | 3/1989 | Herstein |
| 4,812,754 A | 3/1989 | Tracy et al. |
| 4,816,767 A | 3/1989 | Cannon et al. |
| 4,818,169 A | 4/1989 | Schram et al. |
| 4,827,211 A | 5/1989 | Strid et al. |
| 4,838,802 A | 6/1989 | Soar |
| 4,839,587 A | 6/1989 | Flatley et al. |
| 4,845,426 A | 7/1989 | Nolan et al. |
| 4,849,689 A | 7/1989 | Gleason |
| 4,853,613 A | 8/1989 | Sequeira et al. |
| 4,856,426 A | 8/1989 | Wirz |
| 4,856,904 A | 8/1989 | Akagawa |
| 4,858,160 A | 8/1989 | Strid et al. |
| 4,859,989 A | 8/1989 | McPherson |
| 4,871,883 A | 10/1989 | Guiol |
| 4,871,965 A | 10/1989 | Elbert et al. |
| 4,884,026 A | 11/1989 | Hayakawa et al. |
| 4,884,206 A | 11/1989 | Mate |
| 4,888,550 A | 12/1989 | Reid |
| 4,893,914 A | 1/1990 | Hancock et al. |
| 4,894,612 A | 1/1990 | Drake et al. |
| 4,896,109 A | 1/1990 | Rauscher |
| 4,899,998 A | 2/1990 | Teramachi |
| 4,904,933 A | 2/1990 | Snyder et al. |
| 4,904,935 A | 2/1990 | Calma et al. |
| 4,906,920 A | 3/1990 | Huff et al. |
| 4,916,398 A | 4/1990 | Rath |
| 4,918,279 A | 4/1990 | Babel et al. |
| 4,918,374 A | 4/1990 | Stewart et al. |
| 4,923,407 A | 5/1990 | Rice et al. |
| 4,926,118 A | 5/1990 | O'Connor et al. |
| 4,933,634 A | 6/1990 | Cuzin et al. |
| 4,968,931 A | 11/1990 | Littlebury et al. |
| 4,978,907 A | 12/1990 | Smith |
| 4,978,914 A | 12/1990 | Akimoto et al. |
| 4,982,153 A | 1/1991 | Collins et al. |
| 4,994,737 A | 2/1991 | Carlton et al. |
| 5,001,423 A | 3/1991 | Abrami et al. |

| Patent | Date | Inventor |
|---|---|---|
| 5,006,796 A | 4/1991 | Burton et al. |
| 5,010,296 A | 4/1991 | Okada et al. |
| 5,019,692 A | 5/1991 | Nbedi et al. |
| 5,030,907 A | 7/1991 | Yih et al. |
| 5,034,688 A | 7/1991 | Moulene et al. |
| 5,041,782 A | 8/1991 | Marzan |
| 5,045,781 A | 9/1991 | Gleason et al. |
| 5,061,823 A | 10/1991 | Carroll |
| 5,065,089 A | 11/1991 | Rich |
| 5,065,092 A | 11/1991 | Sigler |
| 5,066,357 A | 11/1991 | Smyth, Jr. et al. |
| 5,070,297 A | 12/1991 | Kwon et al. |
| 5,077,523 A | 12/1991 | Blanz |
| 5,084,671 A | 1/1992 | Miyata et al. |
| 5,089,774 A | 2/1992 | Nakano |
| 5,091,691 A | 2/1992 | Kamieniecki et al. |
| 5,095,891 A | 3/1992 | Reitter |
| 5,097,207 A | 3/1992 | Blanz |
| 5,101,149 A | 3/1992 | Adams et al. |
| 5,101,453 A | 3/1992 | Rumbaugh |
| 5,103,169 A | 4/1992 | Heaton et al. |
| 5,105,148 A | 4/1992 | Lee |
| 5,105,181 A | 4/1992 | Ross |
| 5,107,076 A | 4/1992 | Bullock et al. |
| 5,142,224 A | 8/1992 | Smith et al. |
| 5,144,228 A | 9/1992 | Sorna et al. |
| 5,159,752 A | 11/1992 | Mahant-Shetti et al. |
| 5,160,883 A | 11/1992 | Blanz |
| 5,164,661 A | 11/1992 | Jones |
| 5,166,606 A | 11/1992 | Blanz |
| 5,172,049 A | 12/1992 | Kiyokawa et al. |
| 5,198,752 A | 3/1993 | Miyata et al. |
| 5,198,753 A | 3/1993 | Hamburgen |
| 5,198,756 A | 3/1993 | Jenkins et al. |
| 5,198,758 A | 3/1993 | Iknaian et al. |
| 5,202,558 A | 4/1993 | Barker |
| 5,209,088 A | 5/1993 | Vaks |
| 5,210,485 A | 5/1993 | Kreiger et al. |
| 5,214,243 A | 5/1993 | Johnson |
| 5,214,374 A | 5/1993 | St. Onge |
| 5,218,185 A | 6/1993 | Gross |
| 5,220,277 A | 6/1993 | Reitinger |
| 5,221,905 A | 6/1993 | Bhangu et al. |
| 5,225,037 A | 7/1993 | Elder et al. |
| 5,225,796 A | 7/1993 | Williams et al. |
| 5,237,267 A | 8/1993 | Harwood et al. |
| 5,266,889 A | 11/1993 | Harwood et al. |
| 5,278,494 A | 1/1994 | Obigane |
| 5,280,156 A | 1/1994 | Niori et al. |
| 5,303,938 A | 4/1994 | Miller et al. |
| 5,315,237 A | 5/1994 | Iwakura et al. |
| 5,321,352 A | 6/1994 | Takebuchi |
| 5,325,052 A | 6/1994 | Yamashita |
| 5,334,931 A | 8/1994 | Clarke et al. |
| 5,336,989 A | 8/1994 | Hofer |
| 5,345,170 A | 9/1994 | Schwindt et al. |
| 5,369,370 A | 11/1994 | Stratmann et al. |
| 5,371,457 A | 12/1994 | Lipp |
| 5,373,231 A | 12/1994 | Boll et al. |
| 5,382,898 A | 1/1995 | Subramanian |
| 5,397,855 A | 3/1995 | Ferlier |
| 5,404,111 A | 4/1995 | Mori et al. |
| 5,408,189 A | 4/1995 | Swart et al. |
| 5,410,259 A | 4/1995 | Fujihara et al. |
| 5,422,574 A | 6/1995 | Kister |
| 5,434,512 A | 7/1995 | Schwindt et al. |
| 5,451,884 A | 9/1995 | Sauerland |
| 5,457,398 A | 10/1995 | Schwindt et al. |
| 5,461,328 A | 10/1995 | Devereaux et al. |
| 5,469,324 A | 11/1995 | Henderson et al. |
| 5,475,316 A | 12/1995 | Hurley et al. |
| 5,477,011 A | 12/1995 | Singles et al. |
| 5,479,108 A | 12/1995 | Cheng |
| 5,479,109 A | 12/1995 | Lau et al. |
| 5,481,936 A | 1/1996 | Yanagisawa |
| 5,486,975 A | 1/1996 | Shamouilian et al. |
| 5,488,954 A | 2/1996 | Sleva et al. |
| 5,491,426 A | 2/1996 | Small |
| 5,493,070 A | 2/1996 | Habu |
| 5,493,236 A | 2/1996 | Ishii et al. |
| 5,500,606 A | 3/1996 | Holmes |
| 5,506,515 A | 4/1996 | Godshalk et al. |
| 5,508,631 A | 4/1996 | Manku et al. |
| 5,510,792 A | 4/1996 | Ono et al. |
| 5,511,010 A | 4/1996 | Burns |
| 5,515,167 A | 5/1996 | Ledger et al. |
| 5,517,111 A | 5/1996 | Shelor |
| 5,521,522 A | 5/1996 | Abe et al. |
| 5,523,694 A | 6/1996 | Cole, Jr. |
| 5,530,371 A | 6/1996 | Perry et al. |
| 5,530,372 A | 6/1996 | Lee et al. |
| 5,532,609 A | 7/1996 | Harwood et al. |
| 5,539,323 A | 7/1996 | Davis, Jr. |
| 5,546,012 A | 8/1996 | Perry et al. |
| 5,550,480 A | 8/1996 | Nelson et al. |
| 5,550,482 A | 8/1996 | Sano |
| 5,552,716 A | 9/1996 | Takahashi et al. |
| 5,561,377 A | 10/1996 | Strid et al. |
| 5,561,585 A | 10/1996 | Barnes et al. |
| 5,565,788 A | 10/1996 | Burr et al. |
| 5,571,324 A | 11/1996 | Sago et al. |
| 5,572,398 A | 11/1996 | Federlin et al. |
| 5,583,445 A | 12/1996 | Mullen |
| 5,594,358 A | 1/1997 | Ishikawa et al. |
| 5,604,444 A | 2/1997 | Harwood et al. |
| 5,610,529 A | 3/1997 | Schwindt |
| 5,611,946 A | 3/1997 | Leong et al. |
| 5,617,035 A | 4/1997 | Swapp |
| 5,629,631 A | 5/1997 | Perry et al. |
| 5,631,571 A | 5/1997 | Spaziani et al. |
| 5,640,101 A | 6/1997 | Kuji et al. |
| 5,646,538 A | 7/1997 | Lide et al. |
| 5,657,394 A | 8/1997 | Schwartz et al. |
| 5,659,255 A | 8/1997 | Strid et al. |
| 5,663,653 A | 9/1997 | Schwindt et al. |
| 5,666,063 A | 9/1997 | Abercrombie et al. |
| 5,668,470 A | 9/1997 | Shelor |
| 5,669,316 A | 9/1997 | Faz et al. |
| 5,670,888 A | 9/1997 | Cheng |
| 5,675,499 A | 10/1997 | Lee et al. |
| 5,675,932 A | 10/1997 | Mauney |
| 5,676,360 A | 10/1997 | Boucher et al. |
| 5,680,039 A | 10/1997 | Mochizuki et al. |
| 5,682,337 A | 10/1997 | El-Fishaway et al. |
| 5,685,232 A | 11/1997 | Inoue |
| 5,712,571 A | 1/1998 | O'Donoghue |
| 5,729,150 A | 3/1998 | Schwindt |
| 5,731,708 A | 3/1998 | Sobhami |
| 5,773,951 A | 6/1998 | Markowski et al. |
| 5,777,485 A | 7/1998 | Tanaka et al. |
| 5,798,652 A | 8/1998 | Taraci |
| 5,802,856 A | 9/1998 | Schaper et al. |
| 5,804,982 A | 9/1998 | Lo et al. |
| 5,804,983 A | 9/1998 | Nakajima et al. |
| 5,807,107 A | 9/1998 | Bright et al. |
| 5,811,751 A | 9/1998 | Leong et al. |
| 5,828,225 A | 10/1998 | Obikane et al. |
| 5,831,442 A | 11/1998 | Heigl |
| 5,835,997 A | 11/1998 | Yassine |
| 5,838,161 A | 11/1998 | Akram et al. |
| 5,847,569 A | 12/1998 | Ho et al. |
| 5,848,500 A | 12/1998 | Kirk |
| 5,857,667 A | 1/1999 | Lee |
| 5,861,743 A | 1/1999 | Pye et al. |
| 5,869,975 A | 2/1999 | Strid et al. |
| 5,874,361 A | 2/1999 | Collins et al. |

| Patent | Kind | Date | Inventor |
|---|---|---|---|
| 5,879,289 | A | 3/1999 | Yarush et al. |
| 5,883,522 | A | 3/1999 | O'Boyle |
| 5,883,523 | A | 3/1999 | Ferland et al. |
| 5,892,539 | A | 4/1999 | Colvin |
| 5,900,737 | A | 5/1999 | Graham et al. |
| 5,903,143 | A | 5/1999 | Mochizuki et al. |
| 5,910,727 | A | 6/1999 | Fujihara et al. |
| 5,916,689 | A | 6/1999 | Collins et al. |
| 5,923,177 | A | 7/1999 | Wardwell |
| 5,942,907 | A | 8/1999 | Chiang |
| 5,945,836 | A | 8/1999 | Sayre et al. |
| 5,949,579 | A | 9/1999 | Baker |
| 5,952,842 | A | 9/1999 | Fujimoto |
| 5,959,461 | A | 9/1999 | Brown et al. |
| 5,960,411 | A | 9/1999 | Hartman et al. |
| 5,963,027 | A | 10/1999 | Peters |
| 5,963,364 | A | 10/1999 | Leong et al. |
| 5,973,505 | A | 10/1999 | Strid et al. |
| 5,982,166 | A | 11/1999 | Mautz |
| 5,995,914 | A | 11/1999 | Cabot |
| 5,998,768 | A | 12/1999 | Hunter et al. |
| 5,999,268 | A | 12/1999 | Yonezawa et al. |
| 6,001,760 | A | 12/1999 | Katsuda et al. |
| 6,002,263 | A | 12/1999 | Peters et al. |
| 6,002,426 | A | 12/1999 | Back et al. |
| 6,013,586 | A | 1/2000 | McGhee et al. |
| 6,023,209 | A | 2/2000 | Faulkner et al. |
| 6,028,435 | A | 2/2000 | Nikawa |
| 6,029,141 | A | 2/2000 | Bezos et al. |
| 6,031,383 | A | 2/2000 | Streib et al. |
| 6,034,533 | A | 3/2000 | Tervo et al. |
| 6,037,785 | A | 3/2000 | Higgins |
| 6,037,793 | A | 3/2000 | Miyazawa et al. |
| 6,043,667 | A | 3/2000 | Cadwallader et al. |
| 6,049,216 | A | 4/2000 | Yang et al. |
| 6,052,653 | A | 4/2000 | Mazur et al. |
| 6,054,869 | A | 4/2000 | Hutton et al. |
| 6,060,888 | A | 5/2000 | Blackham et al. |
| 6,060,891 | A | 5/2000 | Hembree et al. |
| 6,078,183 | A | 6/2000 | Cole, Jr. |
| 6,091,236 | A | 7/2000 | Piety et al. |
| 6,091,255 | A | 7/2000 | Godfrey |
| 6,096,567 | A | 8/2000 | Kaplan et al. |
| 6,104,203 | A | 8/2000 | Costello et al. |
| 6,111,419 | A | 8/2000 | Lefever et al. |
| 6,114,865 | A | 9/2000 | Lagowski et al. |
| 6,118,894 | A | 9/2000 | Schwartz et al. |
| 6,121,783 | A | 9/2000 | Horner et al. |
| 6,124,723 | A | 9/2000 | Costello |
| 6,124,725 | A | 9/2000 | Sato |
| 6,127,831 | A | 10/2000 | Khoury et al. |
| 6,130,544 | A | 10/2000 | Strid et al. |
| 6,137,302 | A | 10/2000 | Schwindt |
| 6,137,303 | A | 10/2000 | Deckert et al. |
| 6,144,212 | A | 11/2000 | Mizuta |
| 6,147,851 | A | 11/2000 | Anderson |
| 6,160,407 | A | 12/2000 | Nikawa |
| 6,194,907 | B1 | 2/2001 | Kanao et al. |
| 6,198,299 | B1 | 3/2001 | Hollman |
| 6,211,663 | B1 | 4/2001 | Moulthrop et al. |
| 6,222,970 | B1 | 4/2001 | Wach et al. |
| 6,232,787 | B1 | 5/2001 | Lo et al. |
| 6,232,788 | B1 | 5/2001 | Schwindt et al. |
| 6,232,789 | B1 | 5/2001 | Schwindt |
| 6,232,790 | B1 | 5/2001 | Bryan et al. |
| 6,236,975 | B1 | 5/2001 | Boe et al. |
| 6,236,977 | B1 | 5/2001 | Verba et al. |
| 6,245,692 | B1 | 6/2001 | Pearce et al. |
| 6,252,392 | B1 | 6/2001 | Peters |
| 6,257,319 | B1 | 7/2001 | Kainuma et al. |
| 6,259,261 | B1 | 7/2001 | Engelking et al. |
| 6,271,673 | B1 | 8/2001 | Furuta et al. |
| 6,284,971 | B1 | 9/2001 | Atalar et al. |
| 6,288,557 | B1 | 9/2001 | Peters et al. |
| 6,292,760 | B1 | 9/2001 | Burns |
| 6,300,775 | B1 | 10/2001 | Peach et al. |
| 6,310,755 | B1 | 10/2001 | Kholodenko et al. |
| 6,313,649 | B2 | 11/2001 | Harwood et al. |
| 6,320,372 | B1 | 11/2001 | Keller |
| 6,320,396 | B1 | 11/2001 | Nikawa |
| 6,335,628 | B2 | 1/2002 | Schwindt et al. |
| 6,362,636 | B1 | 3/2002 | Peters et al. |
| 6,380,751 | B2 | 4/2002 | Harwood et al. |
| 6,396,296 | B1 | 5/2002 | Tarter et al. |
| 6,407,560 | B1 | 6/2002 | Walraven et al. |
| 6,424,141 | B1 | 7/2002 | Hollman et al. |
| 6,445,202 | B1 | 9/2002 | Cowan et al. |
| 6,480,013 | B1 | 11/2002 | Nayler et al. |
| 6,483,327 | B1 | 11/2002 | Bruce et al. |
| 6,483,336 | B1 | 11/2002 | Harris et al. |
| 6,486,687 | B2 | 11/2002 | Harwood et al. |
| 6,488,405 | B1 | 12/2002 | Eppes et al. |
| 6,489,789 | B2 | 12/2002 | Peters et al. |
| 6,492,822 | B2 | 12/2002 | Schwindt et al. |
| 6,501,289 | B1 * | 12/2002 | Takekoshi ............ 324/758 |
| 6,549,022 | B1 | 4/2003 | Cole, Jr. et al. |
| 6,549,026 | B1 | 4/2003 | Dibattista et al. |
| 6,549,106 | B2 | 4/2003 | Martin |
| 6,573,702 | B2 | 6/2003 | Marcuse et al. |
| 6,605,951 | B1 | 8/2003 | Cowan |
| 6,605,955 | B1 | 8/2003 | Costello et al. |
| 6,608,494 | B1 | 8/2003 | Bruce et al. |
| 6,608,496 | B1 | 8/2003 | Strid et al. |
| 6,617,862 | B1 | 9/2003 | Bruce |
| 6,621,082 | B2 | 9/2003 | Morita et al. |
| 6,624,891 | B2 | 9/2003 | Marcus et al. |
| 6,633,174 | B1 | 10/2003 | Satya et al. |
| 6,636,059 | B2 | 10/2003 | Harwood et al. |
| 6,639,415 | B2 | 10/2003 | Peters et al. |
| 6,642,732 | B2 | 11/2003 | Cowan et al. |
| 6,643,597 | B1 | 11/2003 | Dunsmore |
| 6,686,753 | B1 | 2/2004 | Kitahata |
| 6,701,265 | B2 | 3/2004 | Hill et al. |
| 6,710,798 | B1 | 3/2004 | Hershel et al. |
| 6,720,782 | B2 | 4/2004 | Schwindt et al. |
| 6,724,205 | B1 | 4/2004 | Hayden et al. |
| 6,724,928 | B1 | 4/2004 | Davis |
| 6,734,687 | B1 | 5/2004 | Ishitani et al. |
| 6,744,268 | B2 | 6/2004 | Hollman |
| 6,771,090 | B2 | 8/2004 | Harris et al. |
| 6,771,806 | B1 | 8/2004 | Satya et al. |
| 6,774,651 | B1 | 8/2004 | Hembree |
| 6,777,964 | B2 | 8/2004 | Navratil et al. |
| 6,788,093 | B2 | 9/2004 | Aitren et al. |
| 6,791,344 | B2 | 9/2004 | Cook et al. |
| 6,801,047 | B2 | 10/2004 | Harwood et al. |
| 6,806,724 | B2 | 10/2004 | Hayden et al. |
| 6,836,135 | B2 * | 12/2004 | Harris et al. ............ 324/765 |
| 6,838,885 | B2 | 1/2005 | Kamitani |
| 6,842,024 | B2 | 1/2005 | Peters et al. |
| 6,843,024 | B2 | 1/2005 | Nozaki et al. |
| 6,847,219 | B1 | 1/2005 | Lesher et al. |
| 6,856,129 | B2 | 2/2005 | Thomas et al. |
| 6,861,856 | B2 | 3/2005 | Dunklee et al. |
| 6,873,167 | B2 * | 3/2005 | Goto et al. ............ 324/754 |
| 6,885,197 | B2 | 4/2005 | Harris et al. |
| 6,900,646 | B2 | 5/2005 | Kasukabe et al. |
| 6,900,647 | B2 | 5/2005 | Yoshida et al. |
| 6,900,652 | B2 | 5/2005 | Mazur |
| 6,900,653 | B2 | 5/2005 | Yu et al. |
| 6,902,941 | B2 | 6/2005 | Sun |
| 6,903,563 | B2 | 6/2005 | Yoshida et al. |
| 6,927,079 | B1 | 8/2005 | Fyfield |
| 6,954,078 | B2 * | 10/2005 | Pellegrini Mammana et al. ............ 324/754 |
| 7,001,785 | B1 | 2/2006 | Chen |

| | | |
|---|---|---|
| 7,002,133 B2 | 2/2006 | Beausoleil et al. |
| 7,002,363 B2 | 2/2006 | Mathieu |
| 7,002,364 B2 | 2/2006 | Kang et al. |
| 7,003,184 B2 | 2/2006 | Ronnekleiv et al. |
| 7,005,842 B2 | 2/2006 | Fink et al. |
| 7,005,868 B2 | 2/2006 | McTigue |
| 7,005,879 B1 | 2/2006 | Robertazzi |
| 7,006,046 B2 | 2/2006 | Aisenbrey |
| 7,007,380 B2 | 3/2006 | Das et al. |
| 7,009,188 B2 | 3/2006 | Wang |
| 7,009,383 B2 | 3/2006 | Harwood et al. |
| 7,009,415 B2 | 3/2006 | Kobayashi et al. |
| 7,011,531 B2 | 3/2006 | Egitto et al. |
| 7,012,425 B2 | 3/2006 | Shoji |
| 7,012,441 B2 | 3/2006 | Chou et al. |
| 7,013,221 B1 | 3/2006 | Friend et al. |
| 7,014,499 B2 | 3/2006 | Yoon |
| 7,015,455 B2 | 3/2006 | Mitsuoka et al. |
| 7,015,689 B2 | 3/2006 | Kasajima et al. |
| 7,015,690 B2 | 3/2006 | Wang et al. |
| 7,015,703 B2 | 3/2006 | Hopkins et al. |
| 7,015,707 B2 | 3/2006 | Cherian |
| 7,015,708 B2 | 3/2006 | Beckous et al. |
| 7,015,709 B2 | 3/2006 | Capps et al. |
| 7,015,710 B2 | 3/2006 | Yoshida et al. |
| 7,015,711 B2 | 3/2006 | Rothaug et al. |
| 7,019,541 B2 | 3/2006 | Kittrell |
| 7,019,544 B1 | 3/2006 | Jacobs et al. |
| 7,020,360 B2 | 3/2006 | Satomura et al. |
| 7,020,363 B2 | 3/2006 | Johannessen |
| 7,022,976 B1 | 4/2006 | Santana, Jr. et al. |
| 7,022,985 B2 | 4/2006 | Knebel et al. |
| 7,023,225 B2 | 4/2006 | Blackwood |
| 7,023,226 B2 | 4/2006 | Okumura et al. |
| 7,023,229 B2 | 4/2006 | Maesaki et al. |
| 7,023,231 B2 | 4/2006 | Howland, Jr. et al. |
| 7,025,628 B2 | 4/2006 | LaMeres et al. |
| 7,026,832 B2 | 4/2006 | Chaya et al. |
| 7,026,833 B2 | 4/2006 | Rincon et al. |
| 7,026,834 B2 | 4/2006 | Hwang |
| 7,026,835 B2 | 4/2006 | Farnworth et al. |
| 7,030,599 B2 | 4/2006 | Douglas |
| 7,032,307 B2 | 4/2006 | Matsunaga et al. |
| 7,034,553 B2 | 4/2006 | Gilboe |
| 7,035,738 B2 | 4/2006 | Matsumoto et al. |
| 7,101,797 B2 | 9/2006 | Yuasa |
| 2001/0009377 A1 | 7/2001 | Schwindt et al. |
| 2001/0010468 A1 | 8/2001 | Gleason et al. |
| 2001/0020283 A1 | 9/2001 | Sakaguchi |
| 2001/0030549 A1 | 10/2001 | Gleason et al. |
| 2002/0075027 A1 | 6/2002 | Hollman et al. |
| 2002/0118009 A1 | 8/2002 | Hollman et al. |
| 2003/0057513 A1 | 3/2003 | Leedy |
| 2003/0062915 A1 | 4/2003 | Arnold et al. |
| 2003/0071631 A1 | 4/2003 | Alexander |
| 2003/0141861 A1 | 7/2003 | Navratil et al. |
| 2004/0061514 A1 | 4/2004 | Schwindt et al. |
| 2004/0095145 A1 | 5/2004 | Boudiaf et al. |
| 2004/0100276 A1 | 5/2004 | Fanton |
| 2004/0113639 A1 | 6/2004 | Dunklee et al. |
| 2004/0162689 A1 | 8/2004 | Jamneala et al. |
| 2004/0193382 A1 | 9/2004 | Adamian et al. |
| 2004/0199350 A1 | 10/2004 | Blackham et al. |
| 2004/0207424 A1 | 10/2004 | Hollman |
| 2004/0251922 A1 | 12/2004 | Martens et al. |
| 2005/0024069 A1 | 2/2005 | Hayden et al. |
| 2005/0099192 A1 | 5/2005 | Dunklee et al. |
| 2005/0227503 A1 | 10/2005 | Reitinger |
| 2006/0114012 A1 | 6/2006 | Reitinger |
| 2006/0158207 A1 | 7/2006 | Reitinger |

FOREIGN PATENT DOCUMENTS

| | | |
|---|---|---|
| DE | 31 14 466 | 3/1982 |
| DE | 31 25 552 | 11/1982 |
| DE | 288 234 | 3/1991 |
| DE | 41 09 908 | 10/1992 |
| DE | 43 16 111 | 11/1994 |
| DE | 195 41 334 | 9/1996 |
| DE | 196 16 212 | 10/1996 |
| DE | 196 18 717 | 1/1998 |
| EP | 0 087 497 | 9/1983 |
| EP | 0 201 205 | 12/1986 |
| EP | 0 314 481 | 5/1989 |
| EP | 0 333 521 | 9/1989 |
| EP | 0 460 911 | 12/1991 |
| EP | 0 505 981 | 9/1992 |
| EP | 0 574 149 | 12/1993 |
| EP | 0 706 210 | 4/1996 |
| EP | 0 573 183 | 1/1999 |
| GB | 2 197 081 | 5/1988 |
| JP | 53-052354 | 5/1978 |
| JP | 56-007439 | 1/1981 |
| JP | 62-011243 | 1/1987 |
| JP | 63-143814 | 6/1988 |
| JP | 63-160355 | 7/1988 |
| JP | 1-165968 | 6/1989 |
| JP | 1-178872 | 7/1989 |
| JP | 1-209380 | 8/1989 |
| JP | 1-214038 | 8/1989 |
| JP | 1-219575 | 9/1989 |
| JP | 1-296167 | 11/1989 |
| JP | 2-22837 | 1/1990 |
| JP | 2-22873 | 1/1990 |
| JP | 2-220453 | 9/1990 |
| JP | 3-67187 | 3/1991 |
| JP | 3-175367 | 7/1991 |
| JP | 5-157790 | 6/1993 |
| JP | 5-166893 | 7/1993 |
| JP | 60-71425 | 3/1994 |
| JP | 7-5197 | 1/1995 |
| JP | 7005078 | 1/1995 |
| JP | 7-273509 | 10/1995 |
| JP | 10-116866 | 5/1998 |
| JP | 10-339743 | 12/1998 |
| JP | 11-031724 | 2/1999 |
| JP | 2001-189285 | 7/2001 |
| JP | 2001-189378 | 7/2001 |
| JP | 2002033374 | 1/2002 |
| JP | 2002-164396 | 6/2002 |
| WO | WO 80/00101 | 1/1980 |
| WO | WO 86/07493 | 12/1986 |
| WO | WO 89/04001 | 5/1989 |
| WO | WO 01/69656 | 9/2001 |
| WO | WO 2004/049395 | 6/2004 |

OTHER PUBLICATIONS

John A. Modolo, Gordon Wood Anderson, Francis J. Kub, and Ingham A.G. Mack, "Wafer level high-frequency measurements of photodetector characteristics," Applied Optics, vol. 27, No. 15, Aug. 1, 1988, pp. 3059-3060.

Cascade Microtech, "Introducing the peak of analytical probe stations," MicroProbe Update, May 1990.

H.-J. Eul and B. Schiek, "Thru-Match-Reflect: One Result of a Rigorous Theory for De-Embedding and Network Analyzer Calibration," 18th Euopean Microwave Conference '88, The International Conference Designed for the Microwave Community, Published by Microwave Exhibitions and Publishers Limited, Sep. 12-16, 1988, Stockholm, Sweden.

Cascade Microtech, "Analytical Probe Station," Summit 9000 Series, Jun. 1, 1990.

Maury Microwave Corporation, "MT950D Series, Transistor Test Fixture Software, Software Application Packs," Sep. 20, 1982.

Eric Phizicky, Philippe I.H. Bastiaens, Heng Zhu, Michael Snyder, & Stanley Fields, "Protein analysis on a proteomic scale," Nature 422, insight: review article, Mar. 13, 2003.

Brian J. Clifton, "Precision slotted-Line Impedance Measurements Using computer Simulation for Data Correction," IEEE Transactions on Instrumentation and Measurement, vol. IM-19, No. 4, Nov. 1970, pp. 358-363.

Eric Strid (Cascade Microtech), "Planar Impedance Standards and Accuracy Considerations in Vector Network Analysis," Jun. 1986, 8 pages.

Maury Microwave Corporation, "MT950 Series Transistor Test Fixture (TTF) Notice! Notice! Notice!," May 31, 1985.

Maury Microwave Corporation, MT950 Series Transistor Test Fixture (TTF), Oct. 7, 1982, 4 pages.

Design Technique, "Microstrip Microwave Test Fixture," May 1986, 2 pages.

Ruedi Aebersold & Matthias Mann, "Insight Review Articles, Mass spectrometry-based proteomics," Nature, vol. 422, Mar. 13, 2003, pp. 198-207.

Keithley Instruments, Inc. "Low-Level Measurements for Effective Low Current, Low Voltage, and High Impedance Measurements," Revised Third Edition, Printed Jun. 1984.

Cletus A Hoer, "A High-Power Dual Six-Port Automatic Network Analyzer Used in Determining Biological Effects of RF and Microwave Radiation," IEEE Transactions on Microwave Theory and Techniques, vol. MTT-29, No. 12, Dec. 1981.

Temptronic, "Guarded" Chuck Sketch, Nov. 15, 1989.

Andrej Sali, Robert Glaeser, Thomas Earnest & Wolfgang Baumeister, "From words to literature in structural proteomics," Insight: Review Article, Nature 422, pp. 216-225, Mar. 13, 2003.

Mike Tyers & Matthias Mann, "From genomics to proteomics," Insight overview, Nature vol. 422 Mar. 2003, pp. 193-197.

William Knauer, "Fixturing for Low-Current/Low-Voltage Parametric Testing," Evaluation Engineering, Nov. 1990, pp. 9-12.

J.D.Tompkins, "Evaluating High Speed AC Testers," IBM Technical Disclosure Bulletin, vol. 13, No. 7 Dec. 1970, p. 180.

Jim Fitzpatrick, "Error Models for Systems Measurement," Microwave Journal, May 1978, pp. 63-66.

Sam Hanash, "Disease proteomics," Insight Review Articles, Nature, vol. 422, Mar. 13, 2003, pp. 226-232.

Ronald F. Bauer & Paul Penfield, Jr., "De-Embedding and Unterminating," IEEE Transactions on Microwave Theory and Techniques, vol. MTT-22, No. 3, Mar. 1974, pp. 282-288.

Yousuke Yamamoto, "A Compact Self-Shielding Prober for Accurate Measurement of On-Wafer Electron Devices," IEEE Transactions on Instrumentation and Measurement, vol. 38, No. 6, Dec. 1989, pp. 1088-1093.

R. Y. Koyama & M. G. Buehler, "Semiconductor Measurement Technology: A Wafer Chuck for Use Between—196 and 350° C," U.S. Department of Commerce, National Technical Information Service, PB-293 298, Issued Jan. 1979.

Ken Cole, "ThermoChuck Performance (Fax)," 2 pages, Mar. 10, 1995.

S. Beck & E. Tomann, "Chip Tester," IBM Technical Disclosure Bulletin, Jan. 1985.

L. L. Sohn, O. A. Saleh, G. R. Facer, A. J. Beavis, R. S. Allan, & D. A. Notterman, "Capacitance Cytometry: Measuring biological cells one by one," PNAS vol. 97, No. 20 Sep. 26, 2000, pp. 10687-10690.

Mark S. Boguski & Martin W. McIntosh, "Biomedical informatics for proteomics," Insight: review article, Nature 422, Mar. 13, 2003, pp. 233-237.

Microwave Products, Microwave Journal, Sep. 1988, 1 page.

Hewlett Packard, "HP 4142B Modular DC source/Monitor Practical Applications—High Speed DC Characterization of Semiconductor Devices from Sub pA to 1A," Nov. 1987, pp. 1-4.

Flexion Corporation, "Cryotest Station MP-3," Cascade Microtech, Inc. vs. Micromanipulator Company, Inc., Applebay Exhibit 576, May 13, 1998, 68 pages.

Flexion Corporation, "Cryotest Station MP-3," Cascade Microtech, Inc. vs. Micromanipulator Company, Inc., Applebay Exhibit 578, May 13, 1998, 1 page.

Cascade Microtech, Inc. vs. Micromanipulator Company, Inc., Applebay Exhibit 572, May 13, 1998, 2 pages.

Cascade Microtech, Inc. vs. Micromanipulator Company, Inc., Applebay Exhibits 581A, 581B, and 581C, May 13, 1998, 3 pages.

Flexion Corporation, "AP-1 Cryotest Station," Applebay Exhibit 582, May 13, 1998, 20 pages.

Flexion Corporation, "AP-1 Cryotest Station User Manual," Applebay Exhibit 583, May 13, 1998, 187 pages.

Cascade Microtech, Inc. vs. Micromanipulator Company, Inc., Applebay Exhibits 577A, 577B, 577C, May 13, 1998, 3 pages.

Cascade Microtech, Inc. vs. Micromanipulator Company, Inc., Applebay Exhibit 585, May 13, 1998, 7 pages.

Basu, Saswata and Gleason, Reed " A Membrane Quadrant Probe for R&D Applications" Technical Document—Jun. 1997.

* cited by examiner

THERMAL OPTICAL CHUCK

CROSS-REFERENCE TO RELATED APPLICATIONS

This application claims the benefit of U.S. Provisional Application No. 60/577,752, filed Jun. 7, 2004.

STATEMENT REGARDING FEDERALLY SPONSORED RESEARCH OR DEVELOPMENT

Not applicable.

BACKGROUND OF THE INVENTION

The present invention relates to a chuck for supporting a device under test (DUT) in a probe station and, more particularly, to a chuck adapted to testing electrical and optical properties of a DUT at a temperature other than the ambient temperature.

Many electrical devices, in particular semiconductor based devices, include both electrical components and optical components. Some electro-optical devices receive an optical signal from an optical source and convert the received optical signal into an electrical signal, e.g., a photo-detector. Other electro-optical devices convert an electrical signal into an optical signal, e.g., a light-emitting-diode. Yet other electro-optical devices may include multiple optical and/or electrical components. A probe station may be used to characterize the operation of these devices.

In a probe station, an electrical device-under-test (DUT) is commonly supported on and restrained to the upper surface a chuck while probes are positioned above test pads on the upper surface of the DUT and then brought into contact with the test pads during measurement of the device's operating parameters. The chuck is usually supported on a movable stage permitting movement the chuck to facilitate aligning the probes with the test pads of the DUT. However, an electro-optical device commonly includes electrical connections on a first surface of the device and optical input or output at another surface of the device. For example, an optical signal from a light source may be directed toward the DUT from below, above, or to the side of the DUT while a probe or connector on the upper surface is used to sense the resulting electrical output from the DUT. Similarly for example, a probe or connector may be used to provide an electrical excitation at the upper surface of the DUT while an optical sensor located below, above, or to the side of the DUT is used to sense the resulting optical output.

An optical chuck may used in a probe station to support a DUT that requires an optically accessible path to a surface of the DUT that is normally blocked by the chuck. Harris et al., Patent Application Publication, Pub. No.: US 2003/0042889 A1, incorporated herein by reference, disclose an optical chuck that includes a central, optically transparent medium over which the DUT is supported to provide an optically accessible path to all sides of the DUT. The DUT and the optically transparent medium are supported above a base by a plurality of columnar supports permitting an optical transducer to be located below the transparent window to either sense optical output from the DUT or transmit optical signals to the DUT from below.

While an optical chuck provides an access path for optical signals to or from a DUT, it is often desired to test these devices at a temperature other than the ambient temperature. Thermal chucks are commonly used for testing electrical DUTs at elevated or depressed temperatures. A thermal chuck typically includes a heat source to raise the temperature of the surface of the chuck supporting the DUT and, as a result, the temperature of the DUT. Typically, probe station thermal chucks are heated by thermoelectric devices that rely on the Peltier effect or wire resistance heaters. However, these devices are optically opaque and would interfere with an optical path to the DUT if used to modify the temperature of an optical chuck.

What is desired, therefore, is a thermal optical chuck for use in a probe station that permits a DUT supported on a surface of the chuck to be tested at a temperature other than ambient while providing optical access to the underside the DUT.

DETAILED DESCRIPTION OF THE INVENTION

Testing devices having electrical and optical components involves applying measured electrical or optical inputs and measuring electrical or optical outputs. The electrical inputs and outputs are typically applied and measured by instruments connected to the device by connectors and/or conductive probes and the optical inputs and outputs are typically determined by optical sensors optically coupled to the device. The overall operational characteristics of the device may be characterized from the outputs to the various instruments when the device-under-test (DUT) is electrically and/or optically excited. Often the electrical and optical inputs and outputs to a DUT are arranged on different surfaces of the device. For example, a device may have test pads for electrical excitation located on a first (upper) surface while an optical output is directed from the opposing (lower) surface. An optical chuck provides an optically accessible path to the lower surface of a DUT so that an optical transducer may be positioned below the DUT to either expose the lower surface of the DUT to an optical input or intercept an optical output from the lower surface of the DUT while the upper surface of the DUT is accessible to probes or connectors for making electrical connections.

However, it is often desirable to characterize the DUT at an elevated temperature to simulate the environment in which the device will be used or to determine its performance under operating conditions that stress the device. While an optical chuck provides an accessible optical path to the lower surface of a DUT, the heating devices normally used to modify the temperature of probe station chucks are optically opaque and would interfere with optical access to the DUT if placed in the optical path. The inventor concluded that a thermal optical chuck having an optically transparent heating device could provide a combination of optical accessibility to the lower surface of the DUT and the ability to modify the temperature of the DUT.

Figure 1:
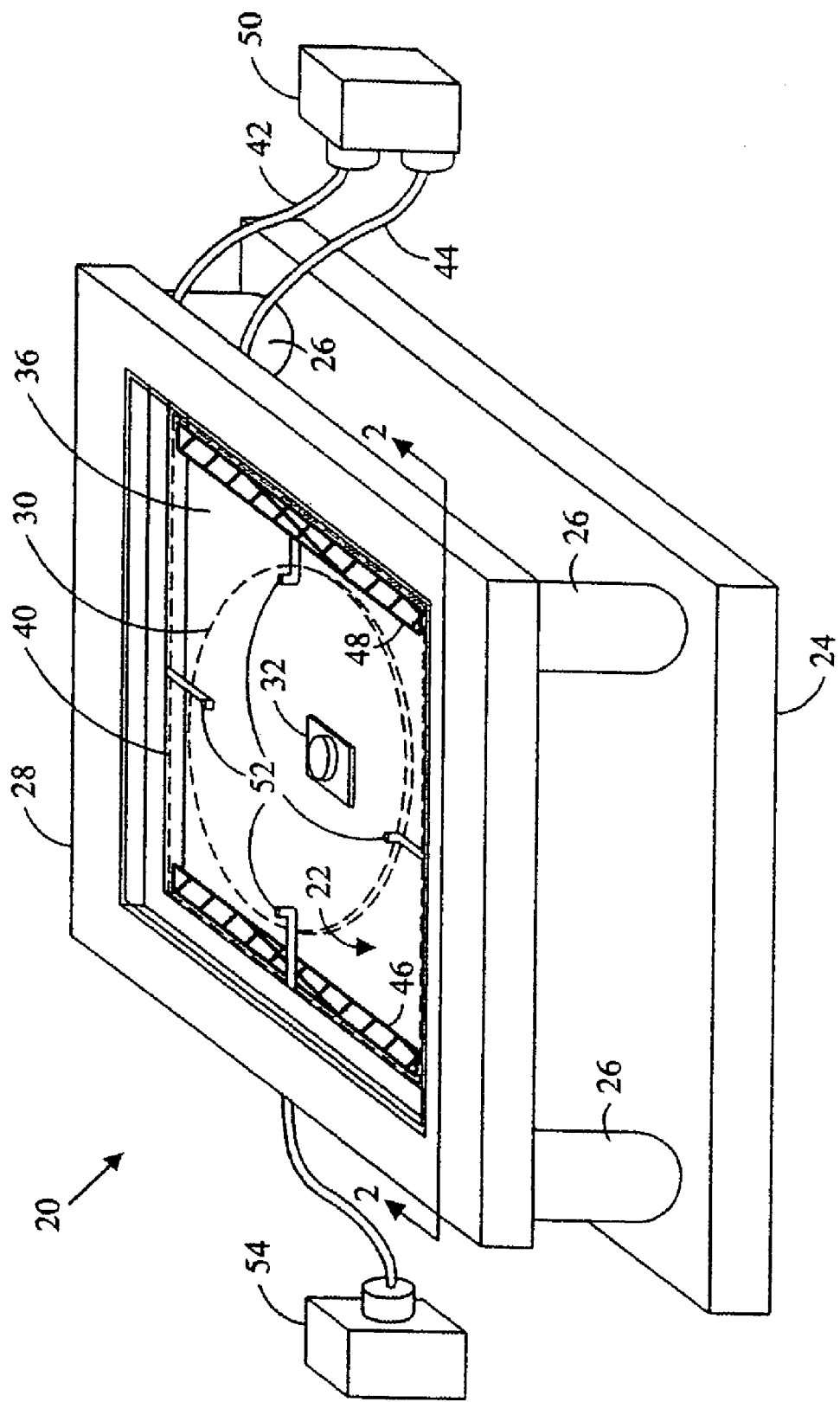
FIG. 1 is a perspective view of a thermal optical chuck assembly illustrating the positioning of an exemplary device-under-test and an optical device for detecting an optical output or supplying an optical input at the lower surface of the device.
Figure 2:
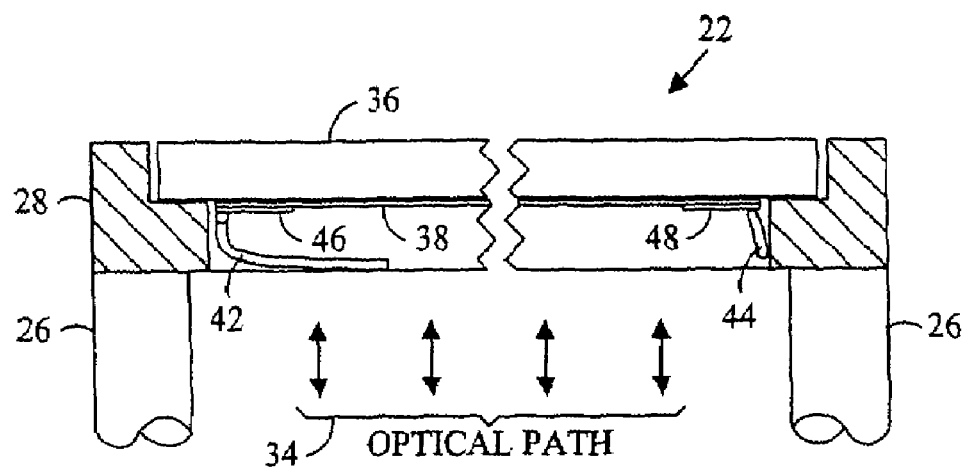
FIG. 2 is a sectional view of the thermal optical chuck of FIG. 1 taken along line 2—2.

Referring in detail to the drawings where similar parts of the invention are identified by like reference numerals, and referring in particular to FIG. 1, a thermal optical chuck assembly 20 suitable for use in a probe station comprises generally a thermal optical chuck 22 supported above a base 24 in a frame 28 by a plurality of supports 26. The base 24 is arranged to be supported on a movable stage in a probe station permitting the position of the chuck and the DUT to be moved to facilitate access to the upper surface of the DUT 30. The spaced relationship of the base 24 and the thermal optical chuck 22 permits optical devices, such as the exemplary optical transducer 32, to be positioned between the base and the thermal optical chuck to either direct optical signals to the lower surface of the DUT 30 or receive the output of optical elements on the lower surface of the DUT. Referring also to FIG. 2, the thermal optical chuck 22 is optically transparent providing an accessible optical path 34 to the lower surface of a DUT supported on the upper surface of the thermal optical chuck.

The thermal optical chuck 22 comprises a transparent plate 36 supported by the frame 28 that is, in turn, supported above the base 24 by the supports 26. The transparent plate 36 may comprise one or more of a variety of commercially available materials; such as, glass, quartz, sapphire, lithium niobate, and fused silica that are transparent to one or more wavelengths of interest for a particular DUT.

Figure 3:
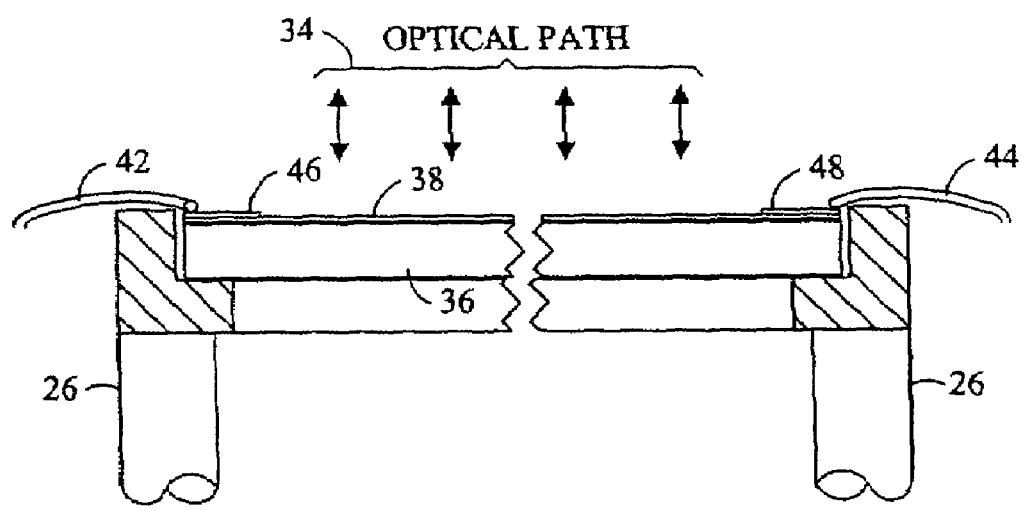
FIG. 3 is a sectional view similar to FIG. 2 illustrating a second embodiment of the thermal optical chuck having a transparent conductor deposited on the upper surface of the chuck.

The temperature of the transparent plate 36 and a DUT 30 supported on the transparent plate is modified by passing an electrical current through a transparent resistor 38 deposited over an area 40 of a surface of the plate. The transparent resistor 38 may comprise any electrical conductor which is transparent to an optical wavelength of interest and which exhibits an appropriate resistance. For example, the transparent resistor may comprise indium tin oxide (ITO), silver-zinc oxide, antimony-tin oxide or a conductive polymer, such as poly(ethylenedioxythiophene) (PEDOT) or doped polyaniline. Referring to FIG. 2, the transparent resistor 38 may be applied the lower surface of the transparent plate 36 or, as illustrated in FIG. 3, the transparent resistor may be applied to the upper surface of the transparent plate if the surface of the DUT in contact with the resistor is insulated or otherwise unaffected by an electrical current passing through the resistor.

An electrical potential is applied to the transparent resistor 38 through leads 42, 44 conductively connected, respectively, to bus bars 46, 48 arranged along opposing edges of the area 40 of the deposited transparent resistor and conductively connected to the resistor. When a potential is applied at the bus bars 46, 48, current flows, from a current source 50, through the deposited layer of conductive transparent resistor material producing heat in proportion to the resistance and square of the current, as expressed by the equation:

$$P=I^2R$$

where: P=power

I=current flowing in the resistor

R=resistance of the transparent resistor

The resistance of a conductor is a function of the intrinsic resistance or resistivity of the material, the cross-sectional area of the conductor, and the length of the conductor. In a preferred embodiment, the material of the transparent resistor 38 is deposited to a uniform depth over an area 40 that is rectangular and, even more preferably, square. Parallel bus bars 42, 44 in conductive contact with the resistor material provide a current path of uniform length over the length of the bus bars, promoting uniform heating over the area 40 of the transparent resistor 38. Since many of the DUTs tested in probe stations are circular wafers, a transparent resistor deposited over a square area can provide uniform heating over the surface of the DUT while minimizing the cross-sectional area of the conductive path through resistor material of a particular depth. However, the depth of the transparent resistor material, the shape of the area 40 over which the material is deposited, and the shape and placement of the bus bars 42, 44 can be manipulated to produce uniform or non-uniform heating or a heated area of another shape, as may be required.

During testing, DUTs are commonly restrained on the top surface of a chuck by air pressure. A plurality of apertures 52 in the top surface of the transparent plate 36 of the thermal optical chuck 22 is selectively connectible to a vacuum source 54 and arranged so that when the DUT 30 placed on the surface it will block air flow to the apertures. When the blocked apertures are connected to the vacuum source 52, air pressure acts on the surface of the DUT 30 to hold the DUT in place on the surface of the chuck. Apertures 52 in the upper surface of the thermal optical chuck 22 are connected to a valve (not illustrated) that selectively connects the apertures to the vacuum source 54 by transparent piping 56, to minimize impact on the optical path 34.

Figure 4:
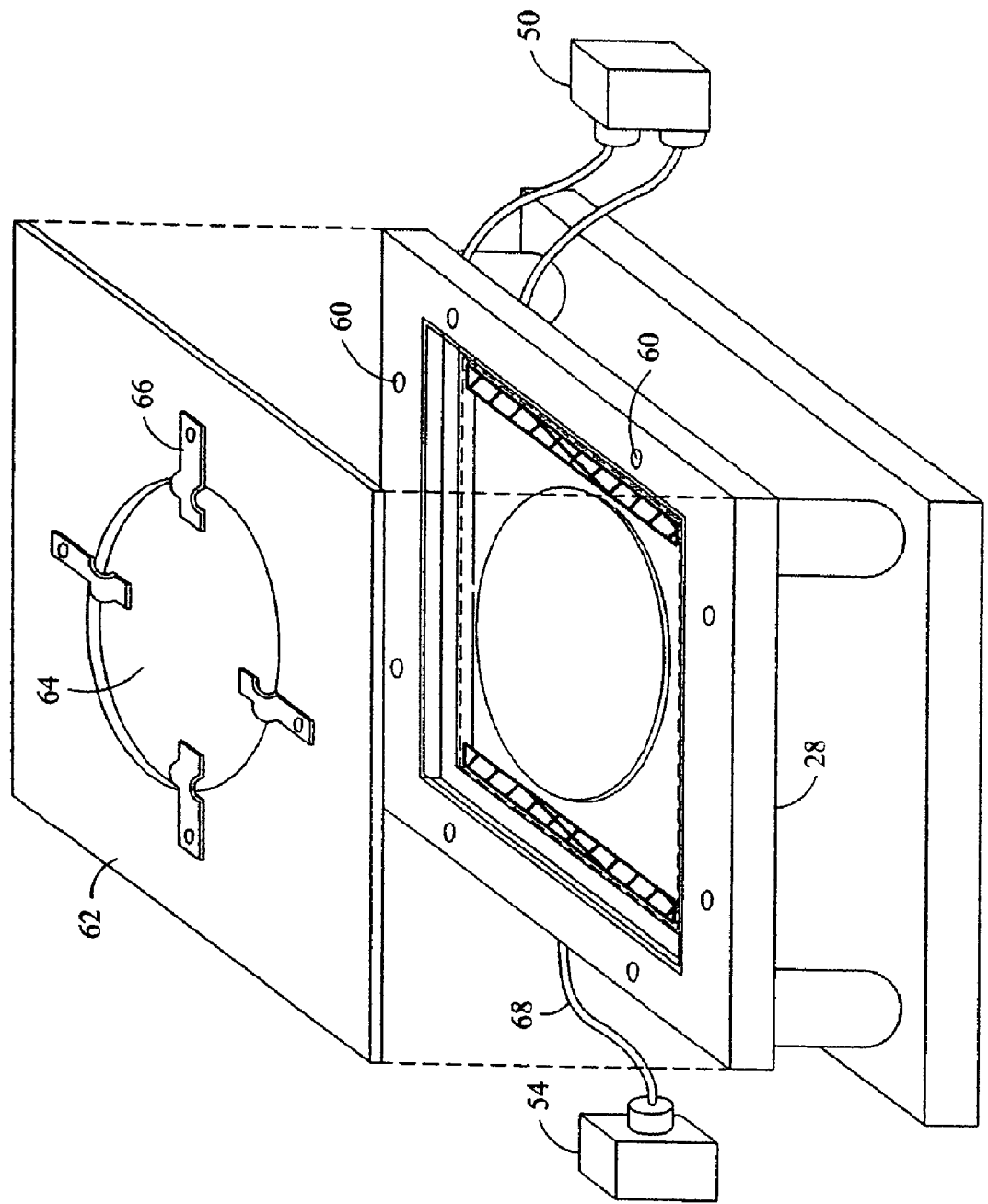
FIG. 4 is a perspective view of a thermal optical chuck including a restraining clamp for the device-under-test.

However, even transparent piping connecting a vacuum source a plurality of spaced apertures in the transparent plate 36 can interfere with optical access to the bottom of the DUT 30. Referring to FIG. 4, an alterative mechanism for securing a DUT 30 to the surface of a thermal optical chuck assembly 22 comprises a clamp plate 62 including a central aperture 64 sufficiently large to accept the DUT 30. A plurality of clips 66 are arranged around the central aperture and attached to the clamp plate 62. When the clamp plate 62 is lowered over the DUT 30, the clips 66 engage the upper surface of the DUT and the clamp plate covers a plurality of apertures 60 in the top surface of the frame 28. The apertures 60 are selectively connectible to a vacuum source 54 by piping 68. When the apertures 60 are connected to the vacuum source 54, air flow to the apertures is blocked by the clamp plate 62. Air pressure exerted on the clamp plate 62 restrains the clamp plate to the frame 28 and the clips 66 restrain the DUT to the thermal optical chuck 22. The optical path 34 is unrestricted over the entirety of the bottom surface of the DUT.

The thermal optical chuck permits a DUT supported on the surface of the chuck to be tested at a temperature other than ambient while providing optical access to the underside the DUT.

The detailed description, above, sets forth numerous specific details to provide a thorough understanding of the present invention. However, those skilled in the art will appreciate that the present invention may be practiced without these specific details. In other instances, well known methods, procedures, components, and circuitry have not been described in detail to avoid obscuring the present invention.

All the references cited herein are incorporated by reference.

The terms and expressions that have been employed in the foregoing specification are used as terms of description and not of limitation, and there is no intention, in the use of such terms and expressions, of excluding equivalents of the features shown and described or portions thereof, it being recognized that the scope of the invention is defined and limited only by the claims that follow.

The invention claimed is:

1. A thermal optical chuck for supporting a device under test in a probe station, said thermal optical chuck comprising:
   (a) a transparent plate having an edge, a first surface for supporting said device under test, and an opposing second surface;
   (b) a transparent conductor having a resistance, said transparent conductor being deposited over an area of at least one of said first and said second surfaces of said transparent plate;
   (c) a first bus bar in conductive contact with said transparent conductor, said first bus bar being connectible to a source of electric current; and
   (d) a second bus bar in conductive contact with said transparent conductor, said second bus bar being connectible to said source of electric current and spaced apart from said first bus bar.

2. The thermal optical chuck of claim 1 wherein said transparent conductor comprises indium tin oxide.

3. The thermal optical chuck of claim 1 wherein said transparent conductor comprises silver zinc oxide.

4. The thermal optical chuck of claim 1 wherein said transparent conductor comprises antimony tin oxide.

5. The thermal optical chuck of claim 1 wherein said transparent conductor comprises a conductive polymer.

6. The thermal optical chuck of claim 5 wherein said conductive polymer comprises poly(ethylenedioxythiophene).

7. The thermal optical chuck of claim 5 wherein said conductive polymer comprises polyaniline.

8. The thermal optical chuck of claim 1 wherein said transparent plate comprises glass.

9. The thermal optical chuck of claim 1 wherein said transparent plate comprises fused silica.

10. The thermal optical chuck of claim 1 wherein said transparent plate comprises quartz.

11. The thermal optical chuck of claim 1 wherein said transparent plate comprises sapphire.

12. The thermal optical chuck of claim 1 wherein said transparent plate comprises lithium niobate.

13. The thermal optical chuck of claim 1 wherein said area comprises a rectangle.

14. The thermal optical chuck of claim 1 wherein said area comprises a square.

15. The thermal optical chuck of claim 1 wherein said second bus bar includes a length arranged substantially parallel to a portion of said first bus bar.

16. The thermal optical chuck of claim 1 further comprising:
   (a) a base; and
   (b) a support maintaining said base and said transparent plate in a spaced relationship.

17. The thermal optical chuck of claim 1 further comprising:
   (a) a frame adjacent to said edge of said transparent plate, said frame including a surface having portions defining an aperture, said aperture being connectible to a vacuum source; and
   (b) a clamp including a first surface arranged to engage an upper surface of a device under test supported by said transparent plate and a second surface arranged to block a flow of air to said aperture when said first surface is engaged with said upper surface of said device under test and said aperture is connected to a vacuum source.

* * * * *